US006812411B2

(12) United States Patent
Belau et al.

(10) Patent No.: US 6,812,411 B2
(45) Date of Patent: Nov. 2, 2004

(54) PRINTED CIRCUIT BOARD CONFIGURATION WITH A MULTIPOLE PLUG-IN CONNECTOR

(75) Inventors: Horst Belau, Langquaid (DE); Joachim Held, München (DE); Wolfram Meyer, Regensburg (DE); Hartwig Reindl, Feucht (DE)

(73) Assignee: Siemens Aktiengesellschaft, Munich (DE)

( * ) Notice: Subject to any disclaimer, the term of this patent is extended or adjusted under 35 U.S.C. 154(b) by 257 days.

(21) Appl. No.: 09/804,323

(22) Filed: Mar. 12, 2001

(65) Prior Publication Data

US 2001/0054512 A1 Dec. 27, 2001

Related U.S. Application Data

(63) Continuation of application No. PCT/DE99/02785, filed on Sep. 2, 1999.

(51) Int. Cl.[7] .......................... H01R 12/04; H05K 1/11
(52) U.S. Cl. ....................................... 174/261; 174/260
(58) Field of Search ..................... 174/36, 268, 261, 174/260; 361/774, 775, 777, 781, 782

(56) References Cited

U.S. PATENT DOCUMENTS

| | | | |
|---|---|---|---|
| 3,093,805 A | * | 6/1963 | Osifchin et al. |
| 3,904,997 A | | 9/1975 | Stineheifer, Sr. |
| 4,644,092 A | * | 2/1987 | Gentry |
| 5,274,195 A | * | 12/1993 | Murphy et al. |
| 5,384,432 A | * | 1/1995 | Noro et al. |
| 5,736,910 A | | 4/1998 | Townsend et al. |
| 6,040,524 A | * | 3/2000 | Kobayashi et al. |

FOREIGN PATENT DOCUMENTS

| | | |
|---|---|---|
| DE | 44 25 803 A1 | 2/1995 |
| DE | 44 00 160 A1 | 7/1995 |
| EP | 0 563 071 | 3/1995 |

OTHER PUBLICATIONS

Japanese Patent Abstract No. 1–138786 (Murakami), dated May 31, 1989, as mentioned on p. 4 of the specification;.
Japanese Patent Abstract No. 9–46006, dated Feb. 14, 1997, as mentioned on p. 3 of the specification;.
"Filter–Steckverbinder für die elektromagnetische Entstörung" (Weber et al.), dated 1998, ATZ Automobiltechnische Zeitschrift 91, pp. 588–591,;.
Japanese Patent Abstract No. 8–306410, dated Nov. 22, 1996, as mentioned on p. 3 of the specification;.
Published International Application No. WO 98/06243 (Feb. 12, 1998), as mentioned on p. 4 of the specification;.
Published International Application No. WO 95/33291 (May 5, 1995), as mentioned on p. 2 of the specification;.

\* cited by examiner

*Primary Examiner*—John B. Vigushin
*Assistant Examiner*—Jeremy Norris
(74) *Attorney, Agent, or Firm*—Laurence A. Greenberg; Werner H. Stemer; Ralph E. Locher

(57) ABSTRACT

A printed circuit board configuration with a multipole plug-in connector has plug pins fixed parallel to the board layer on respective signal conductor tracks. The signal conductor tracks are configured essentially parallel and alternately side-to-side with ground conductor tracks. Furthermore, a ground shielding surface is provided on an adjacent board layer.

9 Claims, 2 Drawing Sheets

PRINTED CIRCUIT BOARD CONFIGURATION WITH A MULTIPOLE PLUG-IN CONNECTOR

CROSS-REFERENCE TO RELATED APPLICATION

This application is a continuation of copending International Application No. PCT/DE99/02785, filed Sep. 2, 1999, now WO 00/16446 which designated the United States.

BACKGROUND OF THE INVENTION

FIELD OF THE INVENTION

The invention relates to a printed circuit board configuration with a multipole plug-in connector.

The invention is directed toward shielding an electronic assembly from radio-frequency electromagnetic radiation generated outside the electronic assembly, such as e.g., radio-frequency interference from transmitters or interference caused by ignition and discharge operations. The invention is also directed toward reducing the radio-frequency emission from the assembly itself, such as e.g. radio-frequency interference current on the supply lines caused by microcontrollers in the assembly. While the entire circuit configuration can be shielded relatively simply by a metal housing, the circuit connections penetrating through the housing represent particular problem zones in this case. The bushings of the connections can be designed in a way to provide the best possible shielding through the realization of so-called filter plug-in connectors, as described for example in the technical paper "Filter-Steckverbinder für die elektromagnetische Entstörung" [Filter plug-in connectors for electromagnetic interference suppression] by Matthias Weber and Hans-Peter Mayr (ATZ Automobiltechnische Zeitschrift 91 (1989), pages 588 to 591). This plug-in connector is designed as a planar low-pass filter using thick-film technology and has signal and ground electrodes which are isolated from one another by a dielectric layer and which overlap one another. In this respect, the filter plug-in connector in accordance with the aforementioned technical paper is constructed in a relatively complex manner.

European Patent EP 0 563 071 B1 describes a radio-frequency-shielding housing of a circuit, e.g. for the control circuit of an airbag of a vehicle, in which the bushing of the plug pins is effected via an anterior space which is isolated and shielded from the rest of the housing.

International Publication WO 95/33291 A1 discloses a surface-mounted plug-in connector in which the plug pins are soldered by their offset board-pertaining ends in a planar manner on the corresponding conductor tracks of the board.

Finally, it is customary in the relevant technical field, for the purpose of shielding radio-frequency interference, to place capacitors between the input and output signal conductor tracks and corresponding ground conductor tracks of a printed circuit board configuration. In this case—as can also be seen, for example, in European Patent EP 0 563 071 B1, already mentioned—the plug pins can run together perpendicularly to the board and can be soldered with a signal conductor track and corresponding contact holes. One connecting pole of the respective capacitors is connected to these signal conductor tracks, and the other connecting pole is located on a common ground track lying parallel before the plug. The emplacement of the capacitors and the shielding effect that can be achieved are problematic in this configuration.

Japanese Patent Document JP 8-306410 A discloses arranging plate-like conductor ends on an end surface of parallel striplines. Only part of the conductor end projects from a dielectric which embeds a section of the conductor end.

Japanese Patent Document JP 9-46006 A discloses a configuration having parallel microstrip conductors between which a ground line is configured. The conductors are configured on a dielectric provided with a ground layer. The ground line is connected to the ground layer.

Published German Patent Application DE 44 00 160 A1 relates to a printed circuit board for a bus system with a multiplicity of connection points for lines which are to be coupled to the bus. One conductor surface is designed as a ground surface which is connected to no other potential of the system. The connection points are provided with filter capacitors.

Japanese Patent Document JP 1-138786 A discloses an integrated circuit having a shielding layer which surrounds the signal-carrying conductors three-dimensionally.

International Publication WO 98/06243 discloses a method for producing shielded conductor tracks on printed circuit boards. The printed circuit board comprises a flexible printed circuit board which is covered on both sides with dielectric bonding sheets. The bonding sheets each have a copper layer. A signal conductor running parallel between two shielding conductors is configured on the flexible printed circuit board.

Published German Patent Application DE 44 25 803 A1 relates to a printed circuit board with cost-effective current parts which can be subjected to high loading. For this purpose, a conductor track is strengthened with a soldered-on metal strip. Such a metal strip can project over the edge of the printed circuit board in order to be used as a conventional flat plug-in prong.

SUMMARY OF THE INVENTION

It is accordingly an object of the invention to provide a printed circuit board configuration which overcomes the above-mentioned disadvantageous of the prior art apparatus of this general type. In particular, it is an object of the invention to provide a printed circuit board configuration with a structurally simple and compactly configured multipole plug-in connector having a good shielding effect.

With the foregoing and other objects in view there is provided, in accordance with the invention, a printed circuit board configuration with a multipole plug-in connector. The configuration includes a board having at least two layers. Each one of the at least two layers has an edge region. A plurality of signal conductor tracks are disposed in the edge region of one of the layers. A plurality of plug pins is provided. Each one of the plurality of the plug pins is fixed to a respective one of the plurality of the signal conductor tracks in a direction parallel to the one of the layers. A plurality of ground conductor tracks is disposed on the one of the layers and is assigned to the plurality of the signal conductor tracks. A side-to-side configuration is provided in which the plurality of the signal conductor tracks and the plurality of the ground conductor tracks are alternatingly disposed on the one of the layers, and in which the plurality of the signal conductor tracks run essentially parallel with respect to the plurality of the ground conductor tracks. At least one filter capacitor is connected between a respective one of the plurality of the signal conductor tracks and a respective one of the plurality of the ground conductor tracks. A ground shielding surface is disposed on an adjacent one of the layers and covers the side-to-side configuration.

Thus, by virtue of the fact that the plug pins are fixed on respective signal conductor tracks and parallel to a board layer, the plug-in connector does not take up appreciable space in the height direction with respect to the board, which provides a compact configuration. The alternate side-to-side configuration of the signal and ground conductor tracks on the board layer and the additionally provided ground shielding surface on an adjacent board layer provide for a good shielding effect. In this case, it is advantageous that all of the conductor tracks as well as the ground shielding surface can be provided using customary production technology for the application of conductor tracks to boards, that is to say with no additional production outlay. Overall, all of the components in the plug area can be placed optimally, which in practice may lead to an improvement of the so-called electromagnetic compatibility with regard to irradiation and radiation emission by more than 20 dB. Furthermore, the shielding chamber provided in the prior art—e.g. the anterior space for bushing the plug pins which is described in European Patent EP 0 563 071 B1—can be completely omitted.

In accordance with an added feature of the invention, the board is formed with a plurality of plated through-holes therein, and the plurality of the plated through-holes electrically connect the plurality of the ground conductor tracks to the ground shielding surface.

In accordance with an additional feature of the invention, each one of the plurality of the ground conductor tracks is electrically connected to the ground shielding surface by more than one of the plurality of the plated-through holes.

In accordance with another feature of the invention, the at least one filter capacitor is one of a plurality of filter capacitors. Each one of the plurality of the filter capacitors is connected between a respective one of the plurality of the signal conductor tracks and a respective one of the plurality of the ground conductor tracks at a location that is remote from the plurality of the plug pins.

In accordance with a further feature of the invention, there is provided, a shielding plate covering the side-to-side configuration. The side-to-side configuration defines a first surface adjacent the ground shielding surface and defines a second surface that is opposite the first surface and that is adjacent the shielding plate.

In accordance with a further added feature of the invention, the plurality of the ground conductor tracks includes two outer ground conductor tracks, and the shielding plate is fixed on and is electrically connected to the two outer ground conductor tracks.

In accordance with a concomitant feature of the invention, the one of the layers defines a first outer board layer, the another one of the layers defines an inner board layer, the at least two layers includes a second outer board layer remote from the first outer board layer, and a similar configuration of signal conductor tracks, plug pins and ground conductor tracks is configured in or on the second outer board layer.

Other features which are considered as characteristic for the invention are set forth in the appended claims.

Although the invention is illustrated and described herein as embodied in a printed circuit board configuration with a multipole plug-in connector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
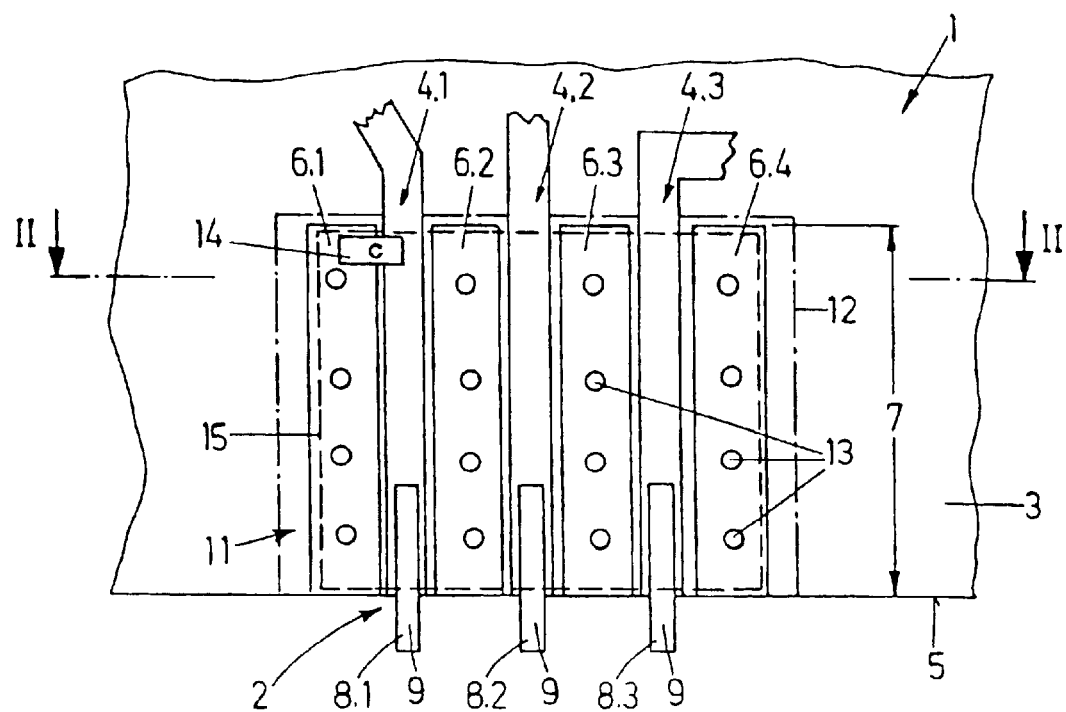
FIG. 1 shows a schematic partial plan view of a printed circuit board configuration with a multipole plug-in connector.

Referring now to the figures of the drawing in detail and first, particularly, to FIG. 1 thereof, there is shown a portion of a two-layer board 1 having a substrate made of PCB material. The figure details an area of the printed circuit board 1 involving a multipole plug-in connector 2. A board layer 3 is positioned at the top of the board 1. Three signal conductor tracks 4.1, 4.2, 4.3 are guided parallel at a distance from one another and orthogonally meet the edge 5 of the board 1. Ground conductor tracks 6.1, 6.2, 6.3, 6.4 are configured alternately with the signal conductor tracks 4.1, 4.2, and 4.3 in a side-to-side fashion and in parallel with the conductor tracks 4.1, 4.2, and 4.3. The ground conductor track 6.2 is configured between the signal conductor tracks 4.1 and 4.2, and the ground conductor track 6.3 is configured between the signal conductor tracks 4.2 and 4.3. Ground conductor tracks 6.1 and 6.4 are configured next to the outer signal conductor tracks 4.1 and 4.3, respectively. The ground conductor tracks 6.1, 6.2, 6.3, 6.4 end at a distance 7 from the edge 5 of the board 1.

Plug pins 8.1, 8.2, 8.3 are on the board layer 3 and bear flat and parallel with the signal conductor tracks 4.1, 4.2, 4.3. The plug pins 8.1, 8.2, 8.3 are soldered in a planar manner on the signal conductor tracks 4.1, 4.2, 4.3 for the purpose of making electrical contact. In this case, the ends 9 of the plug pins 8.1, 8.2, 8.3, which project beyond the edge 5, are provided for plugging into a corresponding socket configuration.

Figure 2:
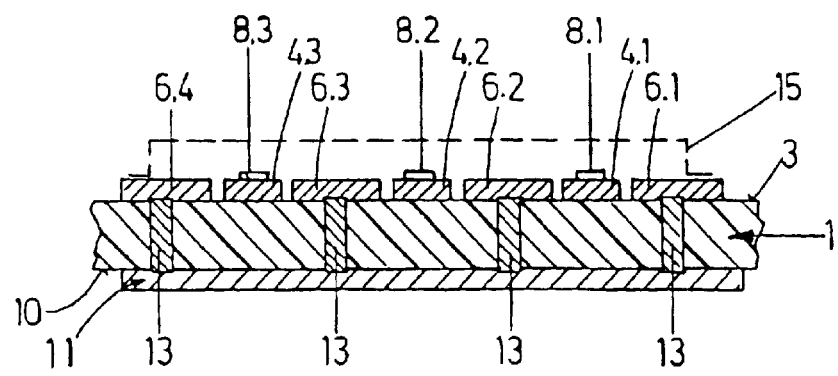
FIG. 2 shows a section through the configuration shown in FIG. 1 that is taken along the section line II—II.

Referring now to FIG. 2, a ground shielding surface 11 is provided on the bottom board layer 10, which is remote from the top board layer 3. The ground shielding surface 11 covers the surface region occupied by the signal conductor tracks 4.1, 4.2, 4.3 and the ground conductor tracks 6.1, 6.2, 6.3 and 6.4. This becomes clear from the contour 12 of the ground shielding surface 11 shown by dash-dotted lines in FIG. 1. The ground shielding surface 11 is electrically connected to each ground conductor track 6.1, 6.2, 6.3 and 6.4 a number of times via plated-through holes 13 running through the board 1. The ground shielding surface 11 can also be realized on an inner layer in the case of multilayer boards.

As is only illustrated in FIG. 1, for the sake of clarity, a filter capacitor 14 is connected between the signal conductor track 4.1 and the ground conductor track 6.1 on the side or end of the plug-in connector 2 which is remote from the plug pin 8.1. Such filter capacitors are connected 14 between corresponding signal/ground conductor track pairs at the end of the ground conductor tracks 6.1, 6.2, 6.3 and 6.4 build up low-impedance parasitic capacitances. These parasitic capacitances act right into the honed frequency range between the signal conductor tracks 4.1, 4.2, and 4.3 and the ground conductor tracks 6.1, 6.2, 6.3 and 6.4. The coupling paths for radio-frequency interference are thus principally restricted to the plug-in connector 2 in the region between the signal conductor tracks 4.1, 4.2, and 4.3 and the ground regions in between and underneath the signal conductor tracks 4.1, 4.2, and 4.3. These ground regions are in the form of the ground conductor tracks 6.1, 6.2, 6.3 and 6.4 and the ground shielding surface 11.

Finally, in order to improve the shielding properties, it is also possible to provide a further shielding plate 15, indicated by dashed lines in the drawings, which straddles the signal conductor tracks 4.1, 4.2, 4.3 in the region of the plug-in connector 2. The further shielding plate 15 is fixed on the two outer ground conductor tracks 6.1, 6.4 and is electrically connected thereto.

It should be pointed out that in the case of multilayer boards, corresponding signal conductor tracks and ground conductor tracks can be configured on the respective outer board layers 3, 10. The ground shielding surface 11 is then situated on one or both of the inner board layers which lie adjacent to these two plug-in connector regions.

Figure 3:
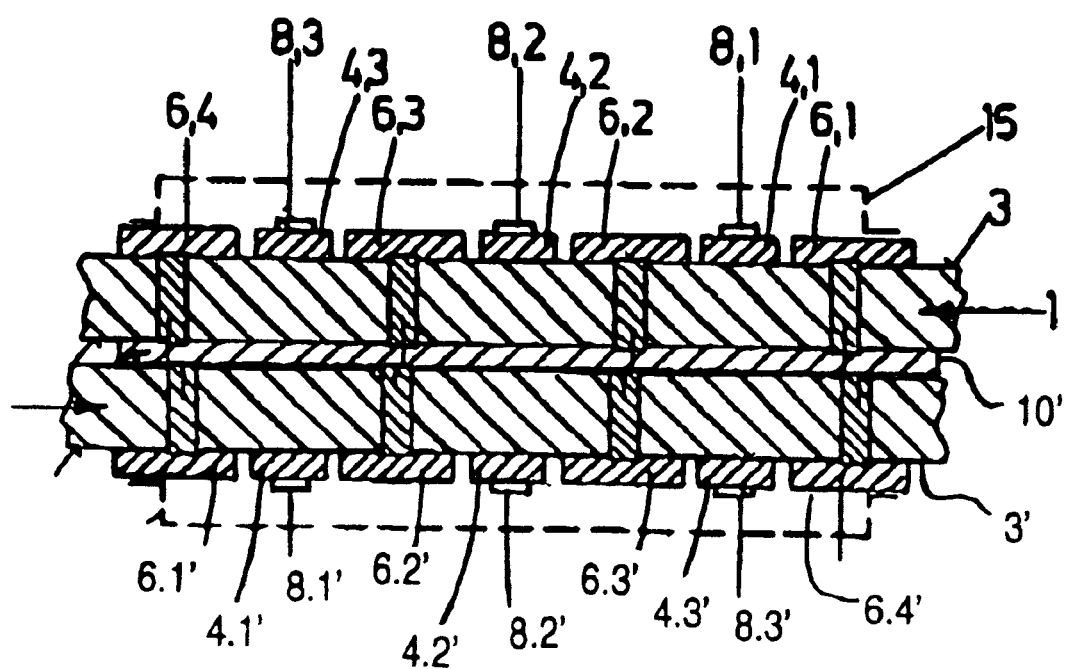
FIG. 3 is a sectional view of a printed circuit board having two outer board layers.

FIG. 3 shows a printed circuit board configuration. The configuration includes a first outer board layer 3, an inner board layer 10', and a second outer board layer 3' remote from the first outer board layer 3. The first outer board 3 and the second outer board layer 3' each define a respective outer edge region. As in the embodiment shown in FIG. 1, the configuration includes a first plurality of signal conductor tracks 4.1, 4.2, and 4.3, a first plurality of plug pins 8.1, 8.2, and 8.3, and a first plurality of ground conductor tracks 6.1, 6.2, and 6.3, all being disposed in a first side-to-side configuration. In addition, a second plurality of signal conductor tracks 4.1', 4.2', and 4.3' are disposed in the edge region of the second outer board layer. The configuration also includes a second plurality of plug pins 8.1', 8.2', and 8.3'. Each one of the second plurality of the plug pins 8.1', 8.2', and 8.3' is fixed to a respective one of the second plurality of the signal conductor tracks in a direction parallel to the second outer board layer 3'. A second plurality of ground conductor tracks 6.1', 6.2', 6.3', and 6.4' are disposed on the second outer board layer 3' and are assigned to the second plurality of the signal conductor tracks 4.1', 4.2', and 4.3'. All of these second signal conductor tracks 4.1', 4.2', and 4.3', plug pins 8.1', 8.2', and 8.3', and ground conductor tracks 6.1', 6.2', 6.3', and 6.4' are disposed in a second side-to-side configuration in which the second plurality of the signal conductor tracks 4.1', 4.2', and 4.3' and said the plurality of the ground conductor tracks 6.1', 6.2', 6.3', and 6.4' are alternatingly disposed on the second outer board layer 3', and in which the second plurality of the signal conductor tracks 4.1', 4.2', and 4.3' run essentially parallel with respect to the second plurality of the ground conductor tracks 6.1', 6.2', 6.3', and 6.4'.

We claim:

1. A printed circuit board configuration with a multipole plug-in connector, comprising:
   a board having at least two layers, each one of said at least two layers having an edge region and a first of said two layers being an outermost layer and a second of said two layers being directly adjacent said outermost layer;
   a plurality of signal conductor tracks disposed in said edge region of said outermost layer;
   a plurality of plug pins, each one of said plurality of said plug pins fixed to a respective one of said plurality of said signal conductor tracks in a direction parallel to said one of said layers;
   a plurality of ground conductor tracks disposed on said outermost layer;
   a side-to-side configuration in which said plurality of said signal conductor tracks and said plurality of said ground conductor tracks are alternatingly disposed on said outermost layer, and in which said plurality of said signal conductor tracks run essentially parallel with respect to said plurality of said ground conductor tracks;
   at least one filter capacitor connected between a respective one of said plurality of said signal conductor tracks and a respective one of said plurality of said ground conductor tracks; and
   a ground shielding surface disposed on said directly adjacent layers and covering said side-to-side configuration.

2. The printed circuit board configuration according to claim 1, wherein said board is formed with a plurality of plated through-holes therein, and said plurality of said plated through-holes electrically connect said plurality of said ground conductor tracks to said ground shielding surface.

3. The printed circuit board configuration according to claim 2, wherein each one of said plurality of said ground conductor tracks is electrically connected to said ground shielding surface by more than one of said plurality of said plated-through holes.

4. The printed circuit board configuration according to claim 1, wherein said at least one filter capacitor includes a plurality of filter capacitors, each one of said plurality of said filter capacitors connected between a respective one of said plurality of said signal conductor tracks and a respective one of said plurality of said ground conductor tracks at a location remote from said plurality of said plug pins.

5. The printed circuit board configuration according to claim 1, comprising a shielding plate covering said side-to-side configuration, said side-to-side configuration defining a first surface adjacent said ground shielding surface and defining a second surface that is opposite said first surface and that is adjacent said shielding plate.

6. The printed circuit board configuration according to claim 5, wherein said plurality of said ground conductor tracks includes two outer ground conductor tracks, and said shielding plate is fixed on and electrically connected to said two outer ground conductor tracks.

7. The printed circuit board configuration according to claim 1, wherein:
   said at least two layers includes a second outermost board layer remote form said first outermost board layer, said second outermost board layer having an outer edge region; and
   said plurality of said signal conductor tracks defines a first plurality of signal conductor tracks, said plurality of said plug pins defines a first plurality of plug pins, said plurality of said ground conductor tracks defines a first plurality of ground conductor tracks, and said side-to-side configuration defines a first side-to-side configuration, the printed circuit board configuration including:
   a second plurality of signal conductor tracks disposed in said edge region of said second outer board layer;
   a second plurality of plug pins, each one of said second plurality of said plug pins fixed to a respective one of said
   second plurality of said signal conductor tracks in a direction parallel to said second outer board layer;
   a second plurality of ground conductor tracks disposed on said second outermost board layer and assigned to said second plurality of said signal conductor tracks; and
   a second side-to-side configuration in which said second plurality of said signal conductor tracks and said second plurality of said ground conductor tracks are alternatingly disposed on said second outermost board layer, and in which said second plurality of said signal conductor tracks run essentially parallel with respect to said second plurality of said ground conductor tracks.

8. The printed circuit board configuration according to claim 1, whrein said board has only two layers.

9. A printed circuit board configuration with a multipole plug-in connector, comprising:

a board having at least three layers, each one of said at least three layers having an edge region; a first of said at least three layers defines a first outer board layer, a second of said at least three layers defines an inner board layer, and a third of said at least three layers includes a second outer board layer remote from said first outer board layer; a plurality of signal conductor tracks disposed in said edge region of one of said layers;

a plurality of plug pins, each one of said plurality of said plug pins fixed to a respective one of said plurality of said signal conductor tracks in a direction parallel to said one of said layers;

a plurality of ground conductor tracks disposed on said one of said layers and assigned to said plurality of said signal conductor tracks;

a side-to-side configuration in which said plurality of said signal conductor tracks and said plurality of said ground conductor tracks are alternatingly disposed on said one of said layers, and in which said plurality of said signal conductor tracks run essentially parallel with respect to said plurality of said ground conductor tracks;

at least one filter capacitor connected between a respective one of said plurality of said signal conductor tracks and a respective one of said plurality of said ground conductor tracks;

a ground shielding surface disposed on an adjacent one of said layers and covering said side-to-side configuration;

said plurality of said signal conductor tracks defining a first plurality of signal conductor tracks, said plurality of said plug pins defining a first plurality of plug pins, said plurality of said ground conductor tracks defining a first plurality of ground conductor tracks, and said side-to-side configuration defining a first side-to-side configuration, the printed circuit board configuration including:

a second plurality of signal conductor tracks disposed in said edge region of said second outer board layer;

a second plurality of plug pins, each one of said second plurality of said plug pins fixed to a respective one of said second plurality of said signal conductor tracks in a direction parallel to said second outer board layer;

a second plurality of ground conductor tracks disposed on said second outer board layer and assigned to said second plurality of said signal conductor tracks; and a second side-to-side configuration in which said second plurality of said signal conductor tracks and said second plurality of said ground conductor tracks are alternatingly disposed on said second outer board layer, and in which said second plurality of said signal conductor tracks run essentially parallel with respect to said second plurality of said ground conductor tracks.

* * * * *

UNITED STATES PATENT AND TRADEMARK OFFICE
CERTIFICATE OF CORRECTION

PATENT NO. : 6,812,411 B2
DATED : November 2, 2004
INVENTOR(S) : Horst Belau et al.

It is certified that error appears in the above-identified patent and that said Letters Patent is hereby corrected as shown below:

Title page,
Item [30], Foreign Application Data, should read as follows:
-- Sep. 10, 1998    (DE)    ......... 198 41 459 --

Signed and Sealed this

Eighth Day of February, 2005

JON W. DUDAS
*Director of the United States Patent and Trademark Office*